United States Patent
Heinonen et al.

(10) Patent No.: US 8,433,273 B2
(45) Date of Patent: Apr. 30, 2013

(54) INCREASING SENSITIVITY OF RADIO RECEIVER

(75) Inventors: Jarmo Juhani Heinonen, Perttek (FI); Sami Vilhonen, Lieto (FI)

(73) Assignee: Nokia Corporation, Espoo (FI)

( * ) Notice: Subject to any disclaimer, the term of this patent is extended or adjusted under 35 U.S.C. 154(b) by 1322 days.

(21) Appl. No.: 11/826,788

(22) Filed: Jul. 18, 2007

(65) Prior Publication Data
US 2008/0299929 A1    Dec. 4, 2008

(30) Foreign Application Priority Data

May 30, 2007    (FI) ..................................... 20075392

(51) Int. Cl.
*H04B 7/00*    (2006.01)
(52) U.S. Cl.
USPC ...................... 455/234.2; 455/239.1; 455/254
(58) Field of Classification Search ............... 455/232.1, 455/234.1, 234.2, 239.1, 250.1, 254, 324, 455/241.1; 375/345
See application file for complete search history.

(56) References Cited

U.S. PATENT DOCUMENTS

| | | | |
|---|---|---|---|
| 6,498,926 B1 * | 12/2002 | Ciccarelli et al. | 455/240.1 |
| 6,625,433 B1 | 9/2003 | Poirier et al. | |
| 6,950,641 B2 | 9/2005 | Gu | |
| 6,961,552 B2 * | 11/2005 | Darabi et al. | 455/241.1 |
| 6,965,655 B1 | 11/2005 | Mostov et al. | |
| 7,054,605 B1 | 5/2006 | Groe | |
| 7,212,798 B1 | 5/2007 | Adams et al. | |
| 7,299,021 B2 * | 11/2007 | P rssinen et al. | 455/226.1 |
| 2003/0025623 A1 * | 2/2003 | Brueske et al. | 341/139 |
| 2003/0064692 A1 | 4/2003 | Shi | |
| 2003/0207674 A1 * | 11/2003 | Hughes | 455/234.1 |
| 2004/0152432 A1 | 8/2004 | Gu | |
| 2005/0221790 A1 * | 10/2005 | Persico et al. | 455/343.2 |
| 2006/0068746 A1 | 3/2006 | Feng et al. | |
| 2006/0222116 A1 | 10/2006 | Hughes et al. | |
| 2007/0049228 A1 * | 3/2007 | Fujishima et al. | 455/253.2 |
| 2007/0197178 A1 * | 8/2007 | Gu | 455/232.1 |

FOREIGN PATENT DOCUMENTS

| | | |
|---|---|---|
| CN | 1736031 A | 2/2006 |
| EP | 0 795 967 A1 | 9/1997 |
| EP | 1503508 A1 | 2/2005 |

OTHER PUBLICATIONS

International Search Report PCT/FI2008/050292 filed May 21, 2008.
European Search Report corresponding to European Patent Application No. 08761688.4 dated Apr. 24, 2012.
Chinese Office Action corresponding to Chinese Patent Application No. 200880018147.6 dated Feb. 24, 2012 and English translation thereof.
Canadian Office Action corresponding to Canadian Patent Application No. 2,687,220 dated Feb. 24, 2012.

* cited by examiner

*Primary Examiner* — Nguyen Vo
(74) *Attorney, Agent, or Firm* — Squire Sanders (US) LLP

(57) ABSTRACT

A direct-conversion radio receiver is provided. The receiver includes a first measurement unit configured to measure a signal level of a received signal at an input of the receiver. The receiver also includes a gain controller configured to stepwise adjust at least a front-end gain and a baseband gain of the receiver when the signal level of the received signal at the input of the receiver exceeds a given sensitivity level, and adjust the front-end gain with at least one further gain step when the input signal level is below the given sensitivity level.

29 Claims, 3 Drawing Sheets

INCREASING SENSITIVITY OF RADIO RECEIVER

FIELD

The invention relates to a method and arrangement for increasing the sensitivity of a radio receiver. Embodiments of the invention can be advantageously applied in a receiver of a mobile station or a base station of a cellular radio system.

BACKGROUND

In telecommunication systems, the transmission channel often causes interference to data transmission. Interference occurs in all systems, but in particular in wireless telecommunication systems, the radio path attenuates and distorts the transmitted signal in a variety of ways. On the radio path, interference is typically caused by multipath propagation, various fades and reflections and also another signals transmitted on the same radio path.

In a radio communication environment, it is typical that the propagation conditions continuously change. Constant variation, or fading, occurs in a signal received both in a mobile station and a base station. However, the farther away transceivers are from each other, the more the transmitted signals attenuate.

Receivers of modern telecommunication systems must fulfil many requirements present in relevant standards. Generally, receivers are designed for a balance of sensitivity and linearity. In general, good linearity improves signal quality.

The sensitivity of the receiver depicts the receiver's ability to receive weak signals. A sensitive receiver can receive a signal further away from the transmitter (for example cellular system base station) than a receiver having poor sensitivity. Alternatively, the transmission power used by a base station can be smaller when a receiver with better sensitivity is used.

It is known that a large gain of a receiver will increase the sensitivity of the receiver. This applies especially to receivers utilising a low noise amplifier as a first stage (or as a one of the first stages) of the receiver. In such a receiver, the high gain amplifier amplifies the signal to such a high level that the noise coming from the following stages will be negligible. However, the high-level signals have the drawback that a lot of current (and power) is needed in the amplifying stage and the later stages to fulfil the linearity requirements.

In devices with limited battery capacity (such as mobile stations) it is not possible to use large amounts of power to compensate the effect of the large gain to linearity. Thus, sensitivity and the gain are limited to keep the linearity of the receiver on an acceptable level.

Another solution to increase the sensitivity of a receiver is to use two low noise amplifiers connected in series. However, this will cause high power consumption to these stages and the latter stages, because of the linearity specifications to be fulfilled.

BRIEF DESCRIPTION OF THE INVENTION

An object of the invention is to provide an improved solution to increase the sensitivity of a receiver. According to an aspect of the invention, there is provided a direct conversion radio receiver comprising: a first measurement unit configured to measure the signal level at the input of the receiver; a gain controller configured to stepwise adjust at least a front-end gain and a baseband gain of the receiver, when the signal level at the input of the receiver exceeds a given sensitivity level, and adjust the front end gain with at least one further gain step, when the input signal level is below the given sensitivity level.

According to another aspect of the invention, there is provided a method in a direct-conversion radio receiver, the method comprising: measuring the signal level at the input of the receiver; adjusting stepwise at least a front-end gain and a baseband gain of the receiver, when signal level at input of the receiver exceeds a given sensitivity level and adjusting the front-end gain with at least one further gain step when the input signal level is below the given sensitivity level.

The embodiments of the invention provide several advantages. For example, when embodiments are applied to a mobile station, the performance increase in the sensitivity of a mobile station can help the mobile station and the network to keep a connection between the mobile station and a base station further away from the base station.

In an embodiment of the invention, the sensitivity of the receiver is increased by amplifying the received signal with an extra gain step when the received signal level is very near a given sensitivity level. Thus, the extra gain step enhances the sensitivity of a mobile station receiver in situations where the receiver is receiving a weak signal and normally would either make a handover to another base station or lose the connection. The extra gain step decreases the linearity of the receiver but the linearity requirements are not a decisive factor in situations where the extra gain step is applied.

LIST OF DRAWINGS

In the following, the invention will be described in greater detail with reference to the embodiments and the accompanying drawings, in which FIG. 1 is a block diagram of a device according to an embodiment of the invention;

DESCRIPTION OF EMBODIMENTS

Figure 1:
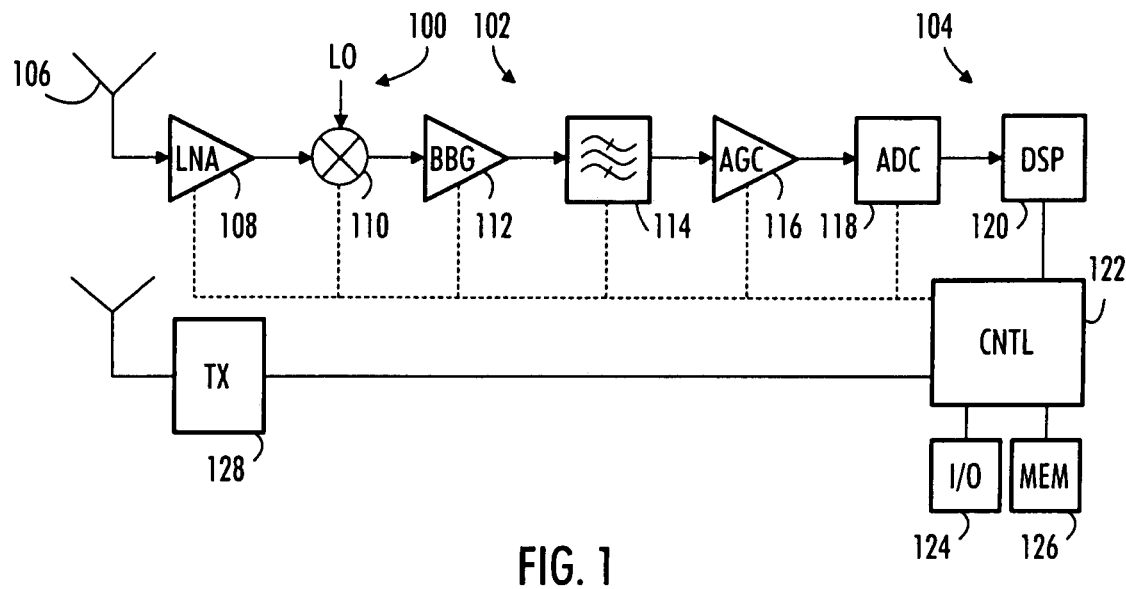

FIG. 1 is a simplified example of a device to which embodiments of the invention can be applied. The device comprises a direct-conversion radio receiver. The radio receiver comprises a front-end 100, an analog baseband section 102 and a digital section 104. The front end 100 comprises an antenna 106 configured to receive radio frequency signals. The received signals are amplified in a low noise amplifier 108. The amplified signal is down-converted to baseband in a mixer 110 using a local oscillator signal LO. The baseband section 102 comprises a baseband gain amplifier 112, a channel selection filter 114, an automatic gain control block 116 and an analog to digital converter (ADC) 118 configured to convert the received signal into digital data for subsequent processing in the digital section 120 of the receiver. The device may further comprise other components, such as filters, which have not been shown in FIG. 1 due to simplicity.

The device comprises a controller 122, which is configured to control the operation of the different parts of the receiver. The controller 122 is connected to the digital section or digital signal processing section 120 of the receiver. The controller can be connected to an input/output (I/O) section 124 of the device. The I/O section 124 may comprise a display, a keyboard, a loudspeaker and a microphone and various interfaces. The controller 122 can be connected to a memory 126 which configured to store software and data required in the operation of the device. If the device is a transceiver, the controller can be connected to a transmitter section 128.

Radio receivers and transceivers of telecommunication systems must fulfil the specifications of the systems. The specifications guarantee that devices of several manufacturers can co-operate in the system. For example, the receivers of a given telecommunication system must have a given sensitivity. Sensitivity may be defined as the amount of power that the receiver must receiver to achieve a specific baseband performance. The performance may be measured using many criteria, such as a specified bit error rate or signal to noise ratio.

Typically, the sensitivity is measured in dBm. For example, in some GSM-based systems a receiver must have a sensitivity of at least −102 dBm. In WCDMA systems utilising Band I, the receivers must have a sensitivity of at least −106.7 dBm and in systems utilising WCDMA Band II, the receivers must have a sensitivity of at least −104.7 dBm. These numerical values are mentioned merely as examples of possible values.

The controller 122 is configured to control the digital section 120 to measure the signal level at the input of the receiver. The gain of the front-end 100 of the device is adjusted as long as the signal level at the input of the receiver exceeds a given sensitivity level. The level is typically selected to be the sensitivity level determined in the specifications of the telecommunication system in which the device is used. Typically the gain adjustment is performed stepwise.

In prior art, the gain of a receiver and especially the first active stages are designed such that both the sensitivity and the linearity requirements of relevant specifications are fulfilled and are in balance. Thus, the best sensitivity of the receiver is realized with the highest gain of the receiver and with the same receiver configuration with which the linearity measurements (such as blocking, for example) are fulfilled.

Situations where the greatest sensitivity is required from a receiver mostly occur when the received signal level is low. In such cases the receiver, such as a mobile station, most probably is far away from a base station. This also means that interfering signals do not exist or they are very low.

In situations where interfering signals do not exist or are very low, the sensitivity can be improved because linearity requirements in such a situation are not the decisive factor. Linearity measurements are made most often in the current widely spread telecommunication systems (like GSM, WCDMA) at the signal level that is 3 dB over the specified system sensitivity level.

In an embodiment, the sensitivity of the receiver is increased by adding an extra gain step when the received signal level is very near or below the given sensitivity level of the relevant specifications. The performance increase in sensitivity can help the receiver and network to keep the connection open longer and further away from a base station.

In an embodiment, the controller 122 receives measurement data from the digital section 120. When the controller 122 detects that the signal level of the received signal has dropped below a given sensitivity level, it may control the front end to increase the gain applied to the received signal. The controller 122 may apply an extra gain adjustment signal to one or more components of the front end 100.

In an embodiment, the extra again adjustment is applied to the low noise amplifier 108 or the mixer 110. In an embodiment, the gain adjustment is done by short circuiting or reducing the value of the resistor(s) used to linearize the front-end stage—collector resistor at the LNA stage or emitter resistor at the Gilbert mixer. As a result, the feedback at that stage is smaller and the gain increases at the front of the receiver so much that the noise from the later receiver stages, like baseband filtering and gain stages, cannot no longer be considered a remarkable contribution to the noise figure of the whole receiver. In addition, the linearity is lost. However, this lost of linearity will not have a detrimental effect on the performance of the receiver.

In an embodiment, the signal levels of possible interfering signals are taken into account when determining the need for extra gain adjustment. For example, the receiver can be configured to measure a value related to the signal level of the interfering signals at the receiver input. The value may be the signal to noise ratio of the received signal or the bit error rate of the received signal.

Figure 2:
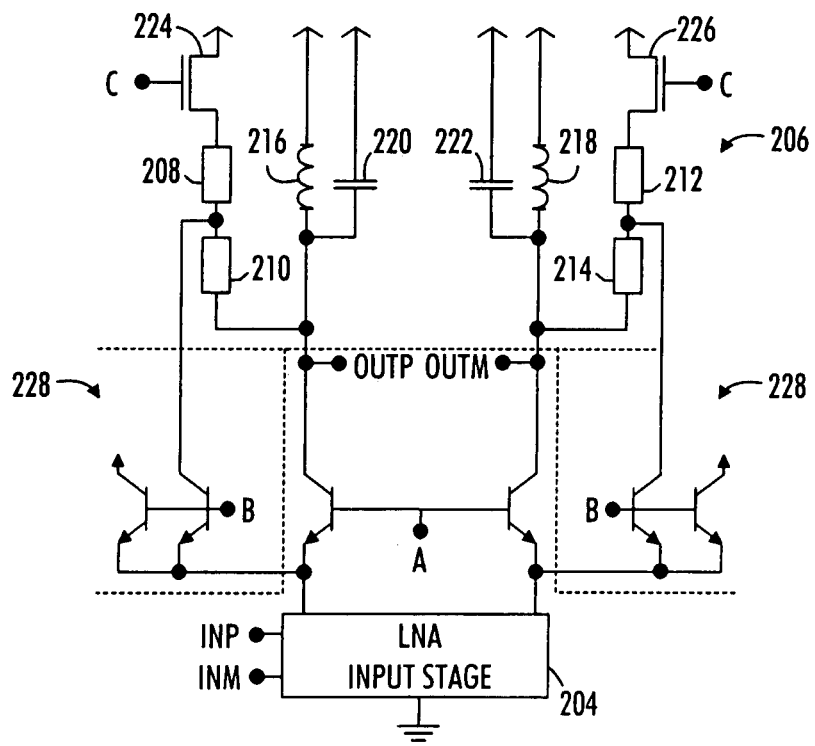
FIG. 2 illustrates an example where an extra gain step is applied to a low noise amplifier.

FIG. 2 illustrates an example where the extra gain step is applied to the low noise amplifier 108. FIG. 2 shows a low noise amplifier arrangement realized with a differential amplifier. The arrangement comprises a cascade stage 228 comprising a set of operational amplifiers and an input stage 204 connected to the cascade stage 228, the input stage having two inputs INP and INM. The cascade stage comprises two control nodes A and B. The arrangement further comprises a collector circuitry 206 consisting of resistors 208 to 214, coils 216, 218 and capacitors 220, 222. The collector circuitry further comprises switches 224 and 226 and control node C controlling the switches.

In normal operation (when the signal level at the input of the receiver exceeds a given sensitivity level), the gain of the low noise amplifier arrangement is controlled by applying control signals to control nodes A and B. In normal operation, voltage is not applied to control node C. Thus, switches 224, 226 controlled by control node C are closed and current may pass through. In an embodiment, the switches are realized with PMOS technology. Resistors 208, 210 are in parallel with coil 216 and capacitor 220 and correspondingly resistors 212, 214 are in parallel with coil 218 and capacitor 222.

In normal operation, a low gain is achieved when voltage is applied to control node B but not to control node A. A high gain is achieved when voltage is applied to control node A but not to control node B. In both of these cases voltage is not applied to control node C.

For the extremely high gain step, voltage is applies to the control nodes C and A but not to control node B. Thus, switches 224, 226 are open and current does not pass through. The collector impedance of the cascade stage 228 is determined by coils 216, 218 and capacitors 220, 222.

Voltages of control nodes in different situations may be summarized as follows:

| | |
|---|---|
| Low gain | A = 0, B = 1, C = 0 |
| High gain | A = 1, B = 0, C = 0 |
| Extra high gain | A = 1, B = 0, C = 1 |

The number of operational amplifiers in the cascade stage may vary depending on the desired number of gain steps.

In an embodiment, the receiver is configured to reduce bandwidth when applying the at least one further gain step.

Figure 3A:
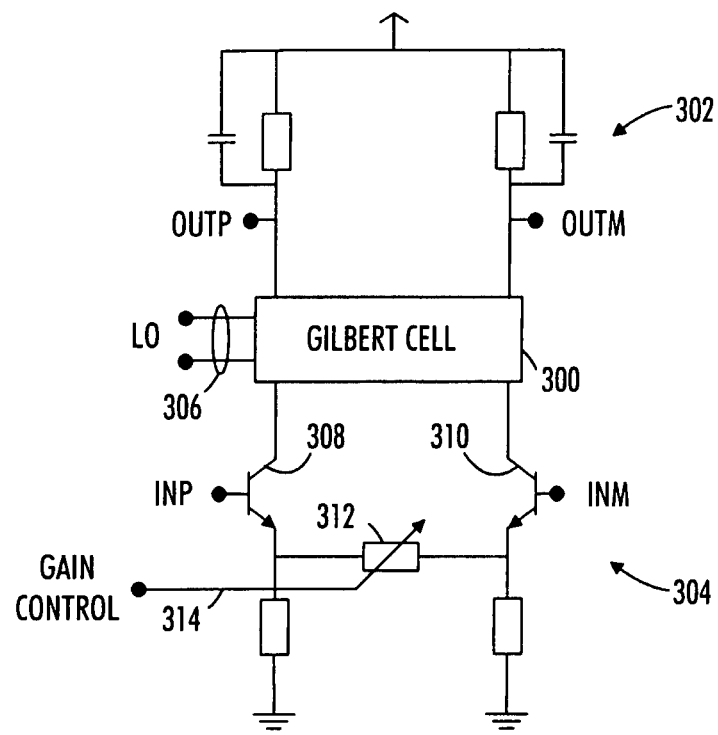
FIGS. 3A and 3B illustrate examples where an extra gain step is applied to a mixer.

FIG. 3A illustrates an example where the extra gain step is applied to the mixer 110. FIG. 3 shows a simplified mixer arrangement realized with a Gilbert cell 300. A Gilbert cell is a cross-coupled differential amplifier arrangement. The arrangement comprises a collector circuitry 302 connected to the collector of the Gilbert cell and an emitter circuitry 304 connected to the emitter of the Gilbert cell. The Gilbert cell receives as input local oscillator signals 306. The received signal is applied as a differential input INP, INM to the base input of transistors 308, 310 of the emitter circuitry. The output signal is obtained as a differential output signal OUTP, OUTM from the collector circuitry.

In an embodiment, gain control is not applied to the mixer 110 in normal operation. In the front end 100, the gain control is applied to the low noise amplifier 108 only. However, the extra gain step may be applied to the mixer by reducing the emitter impedance and increasing the collector impedance. In the example of FIG. 3A, the arrangement comprises a variable resistor 312 with a gain control 314. By adjusting the resistance of the resistor 312, the emitter impedance may be reduced and gain increased.

Figure 3B:
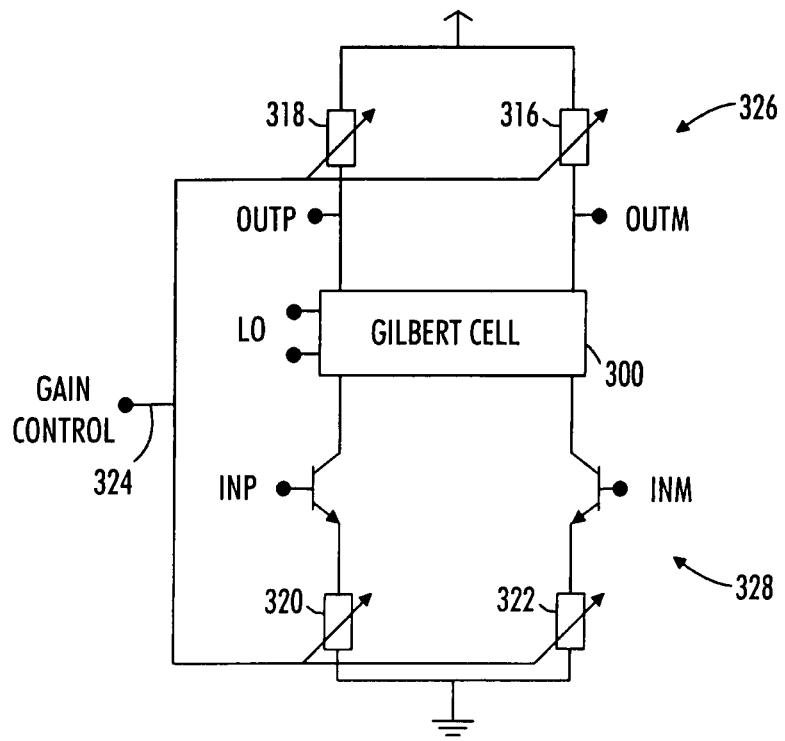

FIG. 3B illustrates another example where the extra gain step is applied to the mixer 110. FIG. 3B shows another simplified mixer arrangement realized with a Gilbert cell 300. The arrangement comprises a collector circuitry 326 connected to the collector of the Gilbert cell and an emitter circuitry 328 connected to the emitter of the Gilbert cell. In this embodiment, a gain control signal 324 is applied to both the collector circuitry 326 and the emitter circuitry 328. The collector circuitry comprises variable resistors 316, 318 and the emitter circuitry comprises variable resistors 320, 322. The gain control signal applied to the resistors causes the resistance of the collector circuitry resistors 316, 318 to increase and the resistance of the emitter circuitry resistors 320, 322 to decrease.

Figure 4:
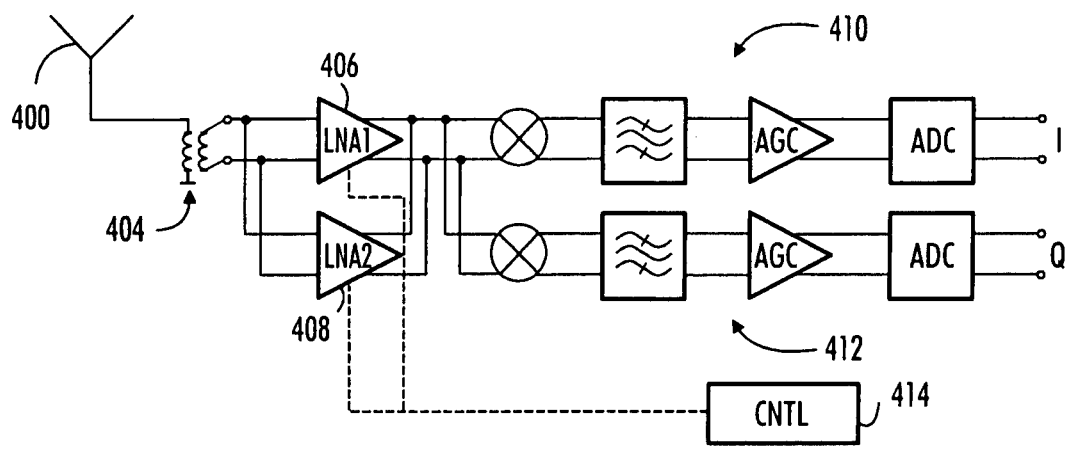
FIG. 4 shows a simplified example of a device to which embodiments of the invention can be applied.

FIG. 4 shows a simplified example of another device to which embodiments of the invention can be applied. The device comprises a direct conversion radio receiver. The receiver comprises an antenna 400 configured to receive radio frequency signals. In this example, the received signal is transformed into a differential form in transformer 404. The receiver comprises a first and a second low noise amplifier 406, 408. The low noise amplifiers have different properties. The first amplifier 406 is configured to tolerate high level signals at its input. The gain of the first amplifier is lower than the gain of the second amplifier 408. In addition, it has a considerably higher noise figure in comparison with the second amplifier 408. The ability to tolerate a high level signal is achieved by using high emitter impedance and other linearizing techniques.

The second low noise amplifier thus has a higher gain and a lower noise figure in comparison with the first amplifier. The noise figure of the first amplifier could be of the order of 10 dB and the noise figure of the second amplifier 2 dB. However, these numerical values are used merely as examples without limiting the invention.

After the low noise amplifiers, the structure of the device is similar to the structure of the device in FIG. 1. However, in this example the device comprises two branches, beginning from the mixers. The first branch 410 is for I-branch signals and the second branch 412 is for Q-branch signals. Each branch comprises a mixer, a channel selection filter, an automatic gain control block and an analog to digital converter (ADC). The outputs of the ADC are connected to the digital section of the device (not shown). The device further comprises a controller 414 configured to control the operation of the device.

As in the example of FIG. 1, the controller 414 is configured to control the digital section (not shown) to measure the signal level at the input of the receiver. In an embodiment, the controller 414 receives measurement data from the digital section and detects that the signal level of the received signal is either above or below a given sensitivity level. On the basis of this data it may control the front end of the device to use either the first low noise amplifier 406 or the second low noise amplifier 408 for amplifying the received signal. The first amplifier 406 is used for obtaining high linearity, the second amplifier 408 for obtaining a low noise figure. The low noise amplifiers are designed such that if the amplifier is turned off it has a high input impedance and when it is powered on its input impedance is adapted to the signal at its input. Thus, the device does not need any switches for directing the received signal to the amplifiers. The controller 414 can select the amplifier at any given moment by powering the desired amplifier up and powering the other amplifier down.

Figure 5:
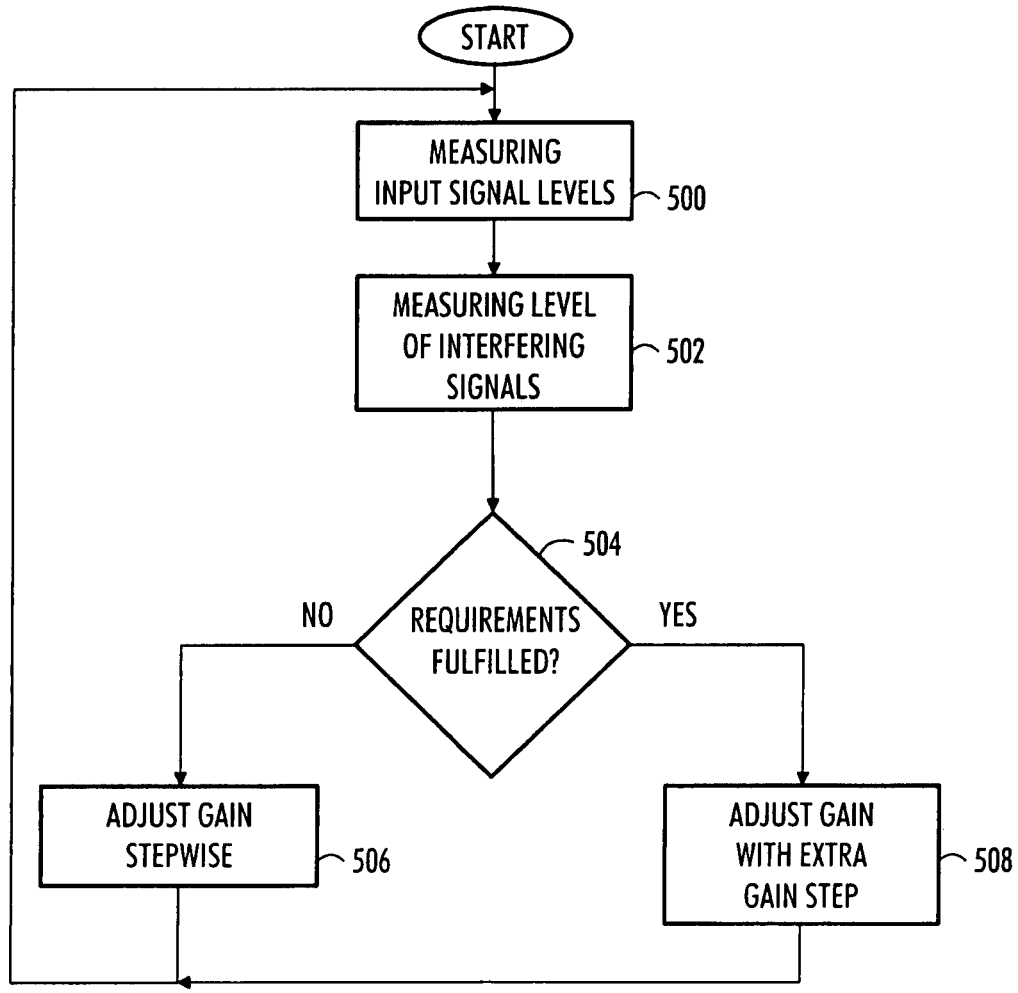
FIG. 5 is a flow chart illustrating an embodiment of the invention.

FIG. 5 is a flowchart illustrating an embodiment. In this example, the embodiment is applied to a direct-conversion radio receiver of a telecommunication system.

In step 500, the received signal level at the input of the receiver is measured.

In step 502, a value or values related to the signal levels of possible interfering signals at the receiver input are measured. The value may be a signal to noise ratio, signal to interference ratio or bit error rate of the received signal.

In step 504, the measured signal levels and values are compared with given thresholds. The measured received signal level is compared with a given sensitivity level. The given sensitivity level may be the sensitivity level required in the specifications of the telecommunication system in question or it may be derived from the level. The measured values related to the signal levels of possible interfering signals are compared with a predetermined level. The level may be selected such that if the value exceeds the predetermined level the interfering signal may be considered negligible. For example, if the measured signal to noise ratio is above a given threshold, the interfering signals may be considered negligible.

If at least one of the measured levels or values does not fulfill a pre-determined threshold requirement, at least a front end gain and a baseband gain of the receiver are adjusted in step 506 stepwise in such a manner that linearity of the receiver is maintained.

If both measured levels or values fulfill predetermined threshold requirements, the front end gain of the receiver is adjusted in step 508 with at least one further gain step in such a manner that the operation of the front end is no longer linear. However, the measurements indicate that the loss of linearity does not reduce the quality of the connection of the receiver with a transmitter.

Embodiments of the invention may be applied to a device which may be a mobile station or a base station of a telecommunication system, a receiver of a telecommunication system, a handheld radiotelephone, or a personal communicator. In addition, the device may be contained within a card or a module that is connected during use to another device, such as a personal computer.

The device may comprise a controller which may be configured to perform at least some of the steps described in connection with the flowchart of FIG. 5 and in connection with FIGS. 1 to 4. The embodiments may be implemented as a computer program comprising instructions for executing a computer process for increasing the sensitivity of a radio receiver. The process may comprise measuring the signal level at the input of the receiver; adjusting stepwise at least a front end gain and a baseband gain of the receiver when the signal level at the input of the receiver exceeds a given sensitivity level and adjusting the front end gain with at least one further gain step when the input signal level is below the given sensitivity level.

The computer program can be stored on a computer program distribution medium readable by a computer or a processor. The computer program medium can be, for example but not limited to, an electric, magnetic, optical, infrared, or semiconductor system, device, or transmission medium. The computer program medium can include at least one of the following media: a computer readable medium, a program storage medium, a record medium, a computer readable memory, a random access memory, an erasable programmable read-only memory, a computer readable software distribution package, a computer readable signal, a computer readable telecommunication signal, computer readable printed matter, and a computer readable compressed software package.

Even though the invention has been described above with reference to the examples according to the accompanying drawings, it is clear that the invention is not restricted thereto but can be modified in several ways within the scope of the appended claims.

The invention claimed is:

1. An apparatus, comprising:
   a processor;
   a mixer; and
   a memory including computer program code, the memory and the computer program code configured to, with the processor, cause the apparatus at least to
   measure a signal level of a received signal at an input of the apparatus,
   stepwise adjust a gain of at least a front-end section and a baseband section of the apparatus with one of a low gain step and a high gain step when the signal level of the received signal at the input of the apparatus exceeds a given sensitivity level, and
   adjust the front-end section with at least one further gain step when the signal level of the received signal is below the given sensitivity level so that an operation of the front-end section is non-linear,
   wherein the memory and the computer program code configured to, with the processor, further cause the apparatus at least to decrease an emitter impedance and increase a collector impedance of the mixer.

2. The apparatus of claim 1, wherein the memory and the computer program code configured to, with the processor, further cause the apparatus at least to measure a value related to the signal level of interfering signals at the apparatus input, and
   adjust the front-end gain with the at least one further gain step only when the measured value is below a given threshold.

3. The apparatus of claim 2, wherein the measured value is a signal to noise ratio of the received signal.

4. The apparatus of claim 2, wherein the measured value is a bit error rate of the received signal.

5. The apparatus of claim 1, further comprising:
   a low noise amplifier, wherein the memory and the computer program code configured to, with the processor, further cause the apparatus at least to decrease feedback in the low noise amplifier.

6. The apparatus of claim 1, further comprising:
   a mixer, wherein the memory and the computer program code configured to, with the processor, further cause the apparatus at least to decrease feedback in the mixer.

7. The apparatus of claim 1, wherein the apparatus comprises separate low noise amplifiers and/or mixers to be selected for use when the signal level of the received signal is above and below a given received signal level.

8. The apparatus of claim 1, wherein the apparatus is a global system for mobile communication (GSM) receiver and the given sensitivity level is −102 dBm.

9. The apparatus of claim 1, wherein the apparatus is a wideband code division multiple access (WCDMA) receiver and the given sensitivity level is −106.7 dBm or −104.7 dBm.

10. The apparatus of claim 1, wherein the apparatus is configured to reduce bandwidth when applying the at least one further gain step.

11. A method, comprising:
    measuring a signal level of a received signal at an input of a receiver;
    stepwise adjusting a gain of at least a front-end section and a baseband section of the receiver with one of a low gain step and a high gain step when the signal level of the received signal at the input of the receiver exceeds a given sensitivity level; and
    adjusting the front-end section with at least one further gain step when the signal level of the received signal is below the given sensitivity level so that an operation of the front-end section is non-linear.

12. The method of claim 11, further comprising:
    measuring a value related to the signal level of interfering signals at the receiver input; and
    adjusting the front-end gain with at least one further gain step only when the measured value is below a given power level.

13. The method of claim 12, wherein the measured value is a signal to noise ratio of the received signal.

14. The method of claim 12, wherein the measured value is a bit error rate of the received signal.

15. The method of claim 11, further comprising:
    decreasing feedback in a front-end low noise amplifier of the receiver.

16. The method of claim 11, further comprising:
    decreasing feedback in a front-end mixer of the receiver.

17. The method of claim 11, further comprising:
    reducing a bandwidth of the receiver when applying the at least one further gain step.

18. The method of claim 11, further comprising:
    selecting a low noise amplifier and/or a mixer to be used in the receiver depending on whether the signal level of the received signal is above or below the given sensitivity level.

19. A system, comprising:
    a radio receiver comprising
    a first measurement unit configured to measure a signal level of a received signal at an input of the receiver, and
    a gain controller configured to stepwise adjust a gain of at least a front-end section and a baseband section of the receiver with one of a low gain step and a high gain step when the signal level of the received signal at the input of the apparatus exceeds a given sensitivity level, and adjust the front-end section with at least one further gain step when the signal level of the received signal is below the given sensitivity level so that an operation of the front-end section is non-linear.

20. A non-transitory computer readable medium comprising a computer program, the computer program being configured to control a processor in a direct-conversion radio receiver to perform:
    measuring a signal level of a received signal at an input of the receiver;
    stepwise adjusting a gain of at least a front-end section and a baseband section of the receiver with one of a low gain step and a high gain step when the signal level of the received signal at the input of the receiver exceeds a given sensitivity level; and
    adjusting the front-end section with at least one further gain step when the signal level of the received signal is below the given sensitivity level so that an operation of the front-end section is non-linear.

21. The non-transitory computer readable medium of claim 20, further comprising:
measuring a value related to the signal level of interfering signals at the receiver input; and
adjusting the front-end gain with the at least one gain step only when the measured value is below a given power level.

22. The non-transitory computer readable medium of claim 21, wherein the measured value is a signal to noise ratio of the received signal.

23. The non-transitory computer readable medium of claim 21, wherein the measured value is a bit error rate of the received signal.

24. The non-transitory computer readable medium of claim 20, further comprising:
decreasing feedback in a front-end low noise amplifier of the receiver.

25. The non-transitory computer readable medium of claim 20, further comprising:
decreasing feedback in a front-end mixer of the receiver.

26. The non-transitory computer readable medium of claim 20, further comprising:
reducing a bandwidth of the receiver when applying the at least one further gain step.

27. The non-transitory computer readable medium of claim 20, further comprising:
selecting a low noise amplifier and/or a mixer to be used in the receiver depending on whether the signal level of the received signal is above or below the given sensitivity level.

28. The non-transitory computer readable medium of claim 20, the computer readable medium comprising at least one of: a computer readable medium, a program storage medium, a record medium, a computer readable memory, and a computer readable software distribution medium.

29. An apparatus, comprising:
first measurement means for measuring a signal level of a received signal at an input of the apparatus; and
gain controller means for stepwise adjusting a gain of at least a front-end section and a baseband section of the apparatus with one of a low gain step and a high gain step when the signal level of the received signal at the input of the apparatus exceeds a given sensitivity level, and adjusting the front-end section with at least one further gain step when the signal level of the received signal is below the given sensitivity level so that an operation of the front-end section is non-linear.

* * * * *